United States Patent [19]

Kumagai et al.

[11] Patent Number: 4,941,031
[45] Date of Patent: Jul. 10, 1990

[54] DYNAMIC MEMORY DEVICE WITH IMPROVED WIRING LAYER LAYOUT

[75] Inventors: Jumpei Kumagai, Yokohama; Syuso Fujii, Kawasaki, both of Japan

[73] Assignee: Kabushiki Kaisha Toshiba, Kawasaki, Japan

[21] Appl. No.: 416,604

[22] Filed: Oct. 3, 1989

[30] Foreign Application Priority Data

Nov. 16, 1988 [JP] Japan .................................. 63-289259

[51] Int. Cl.$^5$ .................... H01L 27/10; H01L 23/48; H01L 27/02; H01L 29/78
[52] U.S. Cl. ........................................ 357/45; 357/68; 357/51; 357/23.6; 357/71
[58] Field of Search ................... 357/45, 51, 23.6, 68, 357/71

[56] References Cited

U.S. PATENT DOCUMENTS

| 4,748,597 | 5/1988 | Saito et al. ........................... 365/230 |
| 4,833,518 | 5/1989 | Matsuda et al. ....................... 357/45 |

FOREIGN PATENT DOCUMENTS

| 72348 | 5/1982 | Japan ..................................... 357/68 |
| 61-274357 | 12/1986 | Japan . | |
| 11262 | 1/1987 | Japan ..................................... 357/45 |
| 76761 | 4/1987 | Japan ..................................... 357/45 |
| 183691 | 7/1988 | Japan ..................................... 357/23.6 |

OTHER PUBLICATIONS

Mano et al., Circuit Technologies for 16Mb DRAMs, IEEE International Solid State Circuits Conference, Feb. 25, 1987, pp. 22-28 & 323-324.

*Primary Examiner*—Rolf Hille
*Assistant Examiner*—Robert P. Limanek
*Attorney, Agent, or Firm*—Finnegan, Henderson, Farabow, Garrett & Dunner

[57] ABSTRACT

A signal line runs in parallel with first to fourth bit lines on a memory cell array of a dynamic memory device. The signal line runs between and along the first and third bit lines, turns at a predetermined position, turns again and runs between and along the second and fourth bit lines. The predetermined turning position is a position corresponding to the half of the bit line length. The result is that the stray capacitances between the signal line and these bit lines are equal at about $\frac{1}{2}C_F$.

20 Claims, 9 Drawing Sheets

DYNAMIC MEMORY DEVICE WITH IMPROVED WIRING LAYER LAYOUT

BACKGROUND OF THE INVENTION

1. Field of the Invention

The present invention relates generally to a dynamic memory device whose memory cells are each constructed by one transistor and one capacitor and are displaced from one another by $\frac{1}{n}$ (n is a natural number equal to or larger than 2) pitch in a channel length direction, and more particularly to improvement of the layout of a conductive wiring layer on a memory cell array of the dynamic memory device.

2. Description of the Related Art

Figure 1:
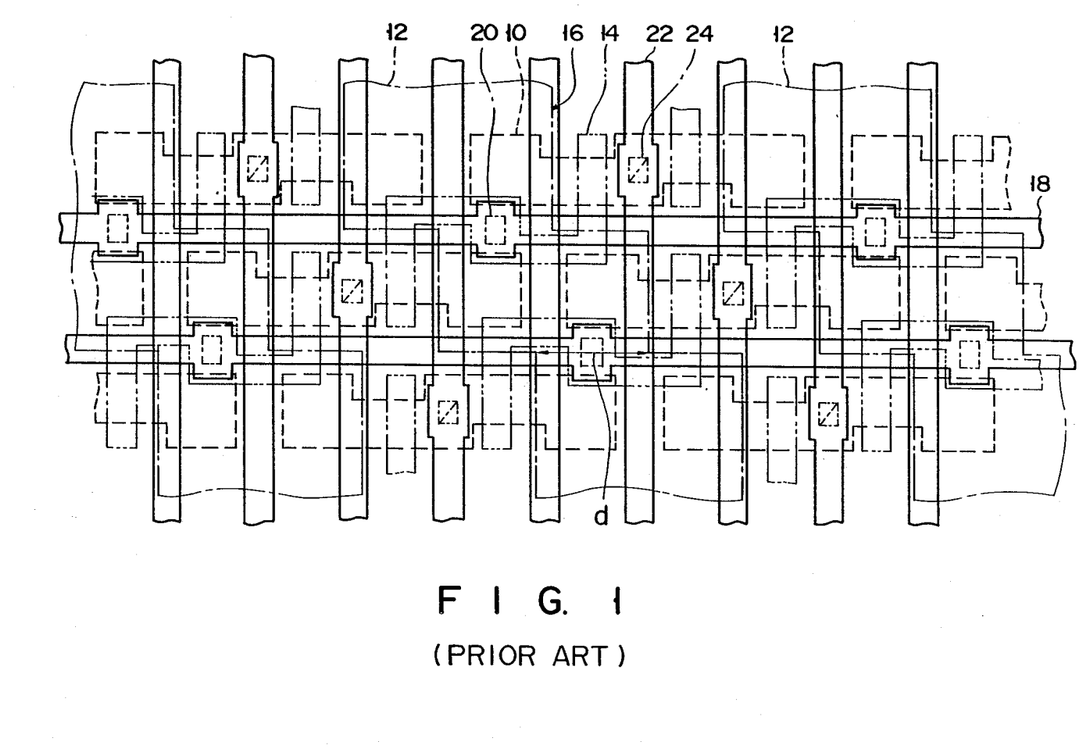
FIG. 1 is a plan view showing a conventional dynamic memory device.

There have been known the dynamic memory devices of the type in which memory cells in a memory cell array are each constructed with one capacitor and one transistor. Some of this type of the memory devices employs such a memory cell array that are memory cells linearly arrayed on a first row are displaced by $\frac{1}{n}$ (n is a natural number equal to or larger than (2) pitch from those in a second row as viewed in the channel length direction of the cell transistor. The memory device of this type is disclosed in Published Unexamined Japanese Patent Application No. 61-274357. The memory device in this gazette has a pattern as shown in FIG. 1.

Each capacitor is sandwiched by an element region 10 and a cell plate electrode 12 that is formed on a capacitor insulating layer layered on the element region 10. In use, the cell plate electrode 12 is common electrode for the memory cells. Each transistor is formed by a gate electrode 14 and diffusion layers (not shown) formed in the element region 10. The gate electrode 14 is layered on an insulating film (not shown) that is successively formed on the cell plate 10 and the element region 10. Groove portion 16 which is formed in a stepped configuration in position corresponding to the transistor region is arranged between adjacent cell plate electrode 12. Each word line 18 is coupled with the gate electrodes 14, through contact holes 20. In the dynamic memory device thus constructed, data are stored in the capacitors in the form of charge. The data is read out of the memory cell and applied to the bit line 22 through a contact 24 formed in the element region 10. The memory cell array thus constructed is advantageous in that since the minimum width "d" of the cell plate 12 may be selected to be relatively wide, if the cell size is reduced, the process to form the cell plate electrode 12 is easy.

Figure 2:
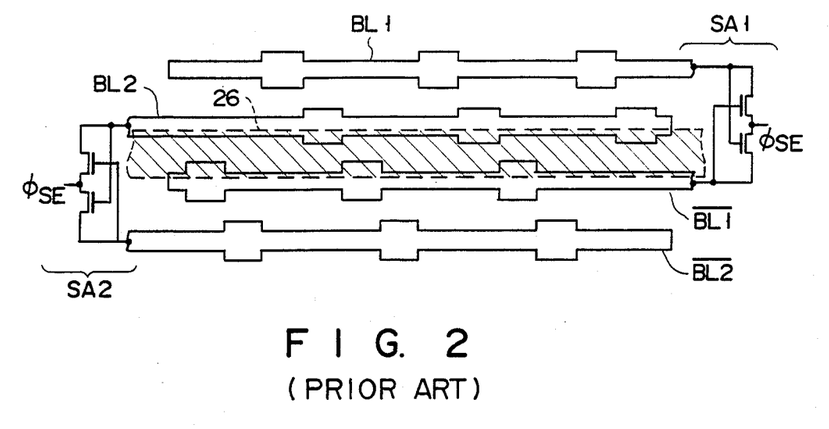
FIG. 2 is a plan view showing a layout of bit lines and a signal line of the memory device of FIG. 1.

In the above dynamic memory device, a bit line pair BL1 and BL1, a bit line pair BL2 and BL2, and sense amplifiers SA1 and SA2 are laid out as shown in FIG. 2. As shown, the bit line pair BL1 and is coupled with the sense amplifier SA1. The bit line pair BL2 and BL2 is coupled with the sense amplifier SA2. The bit line pair BL1 and BL1 and the bit line pair BL2 and BL2 are combined in an interdigitated fashion. One of the paired bit lines BL2 and $\overline{BL2}$ is inserted between the paired bit lines BL1 and $\overline{BL1}$. In the dynamic memory device of the $\frac{1}{4}$ pitch type, such an interdigitated layout of the bit line pairs is essential. The memory device has another line, such as a column select signal line 26, extending along the bit lines.

Figure 3:
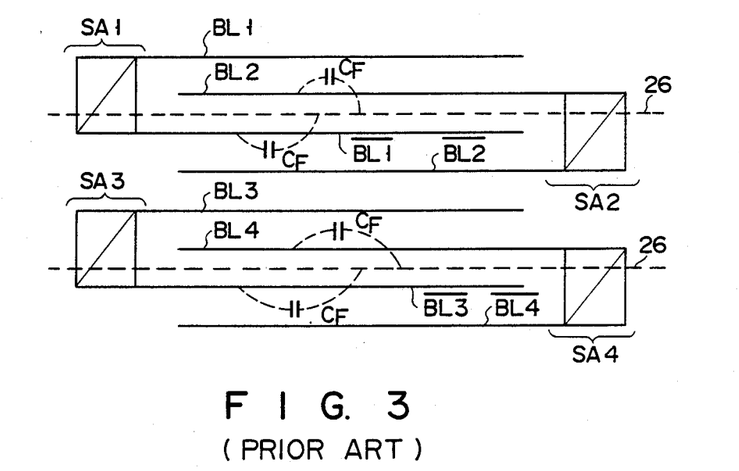
FIG. 3 shows an explanatory diagram useful in explaining an electrical relationship among the bit lines and the signal line that are laid out as shown in FIG. 2.

Electrically, the layout of the bit lines may be modeled as shown in FIG. 3. In a layout that the signal line 26 is laid between the bit lines BL2 and $\overline{BL1}$, as shown in FIG. 2, stray capacitances $C_F$ exist between the signal line 26 and the bit line BL2, and between the signal line 26 and the bit line $\overline{BL1}$, as shown in FIG. 3. The stray capacitances in connection with the bit lines $\overline{BL2}$ and BL1 are smaller than those in connection with the bit lines BL2 and $\overline{BL1}$. In other words, the paired bit lines BL1 and $\overline{BL1}$ are unbalanced in the stray capacitances that are caused by the presence of the signal line 26. Noise traveling through the signal line 26 is transferred through the stray capacitances to the paired bit lines in an imbalanced manner. The same thing is true for the paired bit lines BL2 and $\overline{BL2}$.

An amplitude of the signal read out onto the bit line pairs is proportional to a ratio of a bit line capacitance to a memory cell capacitance, and is very small, several tens mV. The minute signal is differentially amplified by the corresponding sense amplifier, SA1 or SA2. A situation inevitably occurs that the noise is transferred to the paired bit lines through the stray capacitances in an imbalanced manner, before the minute signal is satisfactorily amplified by the sense amplifier. A difference between the imbalanced noise, called a coupling noise, together with the signal, is amplified by the amplifier, and grows. Extremely, the grown noise provides an improper data read operation. That is, the read out data is incorrect. The incorrect data read phenomenon due to the imbalanced stray capacitances is more distinguished in the memory devices of high speed and high integration density. As the integration density increases, the areal (lateral) and vertical (depth) dimensions of the memory device are reduced, so that the stray capacitances increase. If the frequency of a signal traveling through the signal line 26 is higher, the impedance by the stray capacitance is decreased, and hence the amount of noise transferred is also increased.

SUMMARY OF THE INVENTION

To solve the above problems of the prior art, the present invention provides a memory device with an improved layout of a conductive layer. The memory device is of the type in which each memory cell of a memory cell array has one capacitor and one transistor, and the memory cells linearly arrayed on a first row is displaced by $\frac{1}{n}$ (n is a natural number equal to or larger than 2) pitch from those in a second row as viewed in a column direction.

An object of the present invention is to provide a memory device of the above type which is almost free from the coupling noise, is reliably operable, and is suitable for high integration density fabrication.

According to the present invention, there is provided a dynamic memory device comprising a plurality of memory cells each consisting of one transistor and one capacitor; first and second bit lines each coupled with a plurality of memory cells and being arrayed in parallel with separation of a first predetermined distance; a first sense amplifier coupled with the first and second bit lines; third and fourth bit lines each coupled with a plurality of memory cells and being arrayed in parallel with separation of the first predetermined distance, the third bit line being located between the first bit line and the second bit line, and separated from the first bit line by a second predetermined distance, and the fourth bit line being separated from the second bit line by the second predetermined distance, second sense amplifier coupled with the third and fourth bit lines; and a conductive layer extending in the bit line direction, the conductive layer extending between and along the first and third bit lines is bent at a predetermined position, and being bent again and extending between and along the second and fourth bit lines, and a length of the conductive layer which extends between and along the first and third bit lines being equal to that of the conductive layer which extends between and along the second and fourth bit lines.

With such an arrangement, the signal line runs between and along the paired bit lines BL1 and $\overline{BL1}$, turns at a predetermined position, turns again and runs between and along the paired bit lines BL2 and $\overline{BL2}$. The predetermined turning position is a position corresponding to the half of the bit line length. In this respect, the layout of the signal line of the present invention is different from the conventional layout of the signal line in which the signal line extends straightly along the bit lines. The result is that the stray capacitances between the signal line 28 and these bit lines BL1, $\overline{BL1}$, BL2 and $\overline{BL2}$ are equal at about $\frac{1}{4}C_F$. Accordingly, the memory device with the layout of the novel conductive wiring layer is free from the coupling noise problem arising from the imbalanced stray capacitances, viz., incorrect data reading.

DETAILED DESCRIPTION OF THE PREFERRED EMBODIMENTS

Some specific embodiments of a dynamic memory device according to the present invention will be described with reference to the accompanying drawings. The dynamic memory devices to be described in this specification are of the one-capacitor/one-transistor type.

Figure 4:
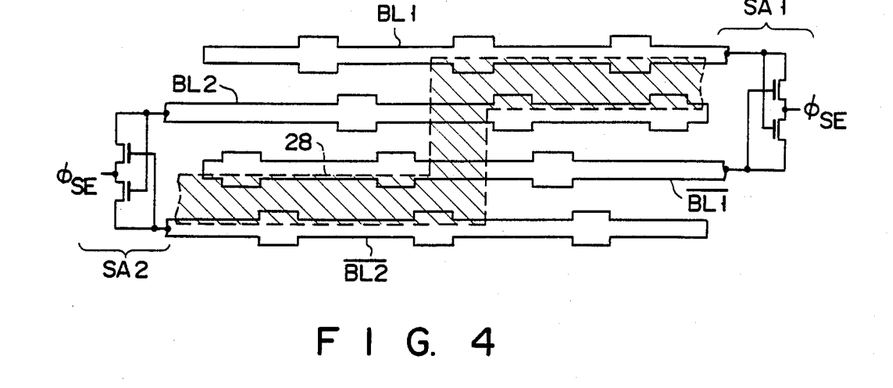
FIG. 4 is a plan view showing a layout of bit lines and a signal line of a dynamic memory device according to a first embodiment of the present invention.
Figure 5:
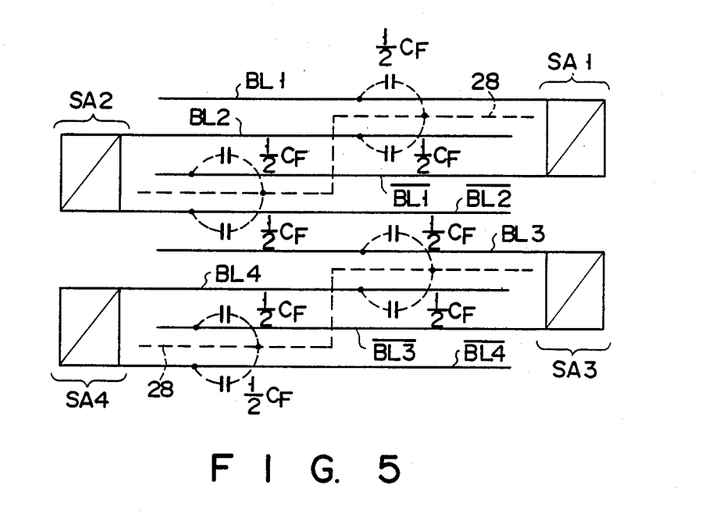
FIG. 5 shows an explanatory diagram useful in explaining an electrical relationship among the bit lines and the signal line that are laid out as shown in FIG. 4.

FIG. 4 is a plan view illustrating a pattern of wiring layers layered on a memory cell array of a dynamic memory device according to a first embodiment of the present invention. FIG. 5 shows a model of an electrical interrelation of the wiring layer pattern of FIG. 4.

As shown in FIG. 4, a bit line pair BL1 and $\overline{BL1}$ and a bit line pair BL2 and $\overline{BL2}$ run horizontally (as viewed in the drawing) and in parallel on a memory cell array of the dynamic memory device. A signal line 28 as is shaded by slanted lines and is disposed between bit lines $\overline{BL1}$ and $\overline{BL2}$ runs in parallel with the bit lines, turns upward at a predetermined position and runs across the bit lines, and turns again to the right and goes between and along the bit lines BL1 and BL2. If the predetermined turn position of the signal line 28 is selected to be a point corresponding to the half length of the bit line, the stray capacitances existing between the signal line 28 and those bit lines BL1, $\overline{BL1}$, BL2 and $\overline{BL2}$ are equal at approximately $\frac{1}{4}C_F$, as shown in FIG. 5. In other words, the bit lines are balanced in their stray capacitance.

With such a layout of the signal line 28, noise derived from the signal line 28 is uniformly distributed to the respective bit lines. Accordingly, there is eliminated the coupling noise, viz., a difference between the noises transferred to the paired bit lines through the different stray capacitances, and consequently the improper data read due to the coupling noise. Therefore, a dynamic memory device based on the signal line layout as mentioned above is reliable and may be fabricated in a high integration density.

In the turning portion or vertical portion of the signal line 28, viz., traversing the bit lines, the stray capacitances of the paired bit lines are unbalanced by an amount corresponding to the width of the signal line or its near value. Actually, however, this unbalance of the capacitance is negligible because the signal line width is satisfactorily shorter than the bit line length. More exactly, if the length of the bit line is 300 μm, a length difference caused by the traversing portion of the signal line, viz., the signal line width, is 1.0 μm, i.e., 1/300 of the bit line length. The stray capacitance caused in connection with the width is extremely small or negligible. Though the signal line 28 is bent at right angle at its turning or vertical portion as shown in FIG. 4, it is possible to obliquely bend it there if only the stray capacitance is negligibly small.

The coupling noise problem exists also in the power line, because a power voltage varies during the read operation. The wiring layer layout according to the present invention is applicable to the power line. In this case, the noise due to the varied power voltage is uniformly transferred to the bit lines, to remove the coupling noise problem that the difference of the signal voltage between the paired bit lines grows, resulting in improper data read.

Figure 6:
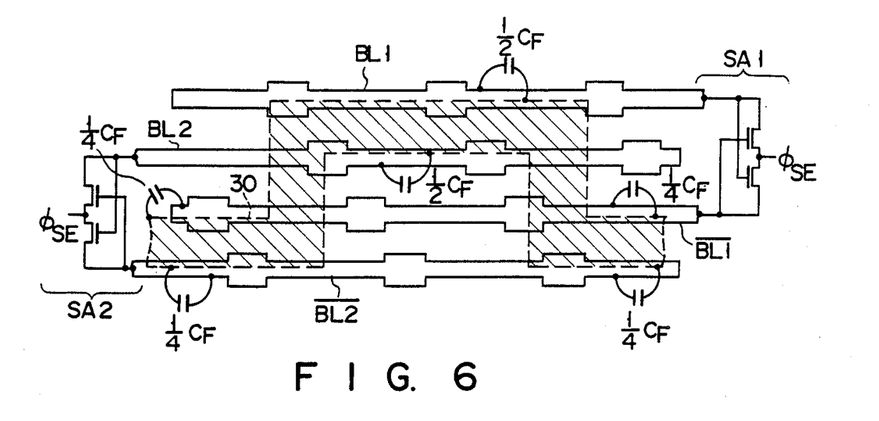
FIGS. 6 to 9 are plan views showing layouts of bit lines and a signal line of a dynamic memory device according to second to fifth embodiments of the present invention, the illustration of FIG. 9 being for a case that the present invention is applied for a memory cell array in which the memory cells on the adjacent rows are displaced by $\frac{1}{4}$ pitch with respect to a column line.

FIG. 6 is a plan view illustrating a pattern of wiring layers layered on a memory cell array of a dynamic memory device according to a second embodiment of the present invention. As shown, a signal line 30 shaded by slanted lines runs between and along the bit lines $\overline{BL1}$ and $\overline{BL2}$, turns upward at a first position and traverses the bit lines, turns again to the right and runs between and along the bit lines BL1 and BL2, turns downwardly at a second position and across the bit lines, and turns to the right and runs between and along the the bit lines $\overline{BL1}$ and $\overline{BL2}$. That is, the signal line 30 is shaped like an inverted U.

The turning points of the signal line 30 are selected such that the stray capacitances of the bit lines BL and $\overline{BL}$ and the signal line 30 are equal to each other. In this instance, those points are respectively points corresponding to $\frac{1}{4}$ and $\frac{3}{4}$ of the bit line length. With the turning points so selected, for the bit line pair BL1 and $\overline{BL1}$, the stray capacitance between the signal line 30 and the bit line BL1 is $\frac{1}{2}C_F$, as shown. The stray capacitance between the signal line 30 and the bit line $\overline{BL1}$ is $\frac{1}{4}C_F + \frac{1}{4}C_F = \frac{1}{2}C_F$. Thus, those stray capacitances are equal to each other. For the bit line pair BL2 and $\overline{BL2}$, the stray capacitance between the signal line 30 and the bit line BL2 is $\frac{1}{2}C_F$, as shown. The stray capacitance between the signal line 30 and the bit line $\overline{BL2}$ is $\frac{1}{4}C_F + \frac{1}{4}C_F = \frac{1}{2}C_F$. Those stray capacitances are also equal to each other. Accordingly, the noise derived from the signal line 30 is equally transferred to the bit line pairs, thereby solving the coupling noise problem arising from the unbalanced stray capacitances. Thus, the noise signal voltages are substantially equal to each other. The resultant memory device is free from the improper data read operation, and hence is reliable and high in integration density.

Also in this embodiment, the portions of the signal line 30 that transverse the bit lines cause differences of the stray capacitances in connection with the bit lines. The difference amounts to about the width of the signal line, but is negligible as in the first embodiment.

The technical idea of the second embodiment is also applicable to the power line layout. If it is applied to the power line layout, the adverse effect by the noise due to a voltage variation during the IC operation may also be removed.

While in the first and second embodiments as mentioned above, the technical ideas of the present invention have been applied to the wiring layer such as the layout of the signal line and the power line, it is evident that they are applicable for the wiring layer such as the column select lines, second bit lines, and DQ lines. Further, the wiring layer such as the signal line may be bent at a desired number of positions if the stray capacitances $C_F$ between the wiring layer and the paired bit lines BL and $\overline{BL}$ are equal, for example, the stray capacitance of the wiring layer and one bit line BL is set at $\frac{1}{2}C_F$, and that between the wiring layer and the other bit line $\overline{BL}$ is set at $\frac{1}{2}C_F$.

In circuit design, the turning points of the wiring layer must be selected while taking into account other circuits and components. This is essential for realizing an ideal circuit pattern. Further, the signal line is preferably laid out away from the sense amplifiers SA1 and SA2. This approach makes the circuit design easy, and is suitable for IC fabrication.

Figure 7:
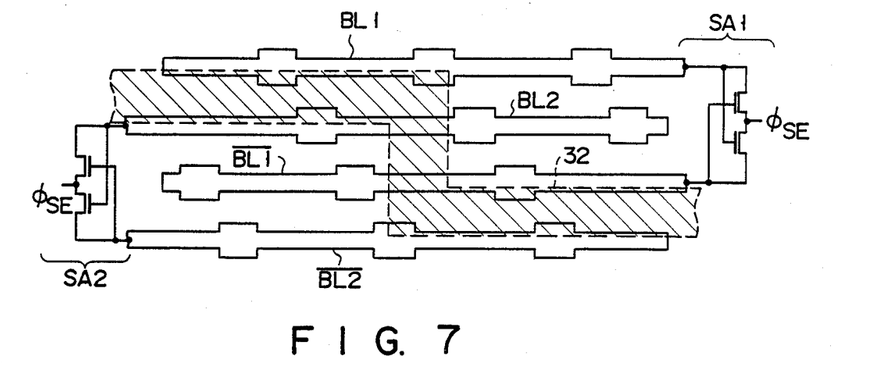
Figure 8:
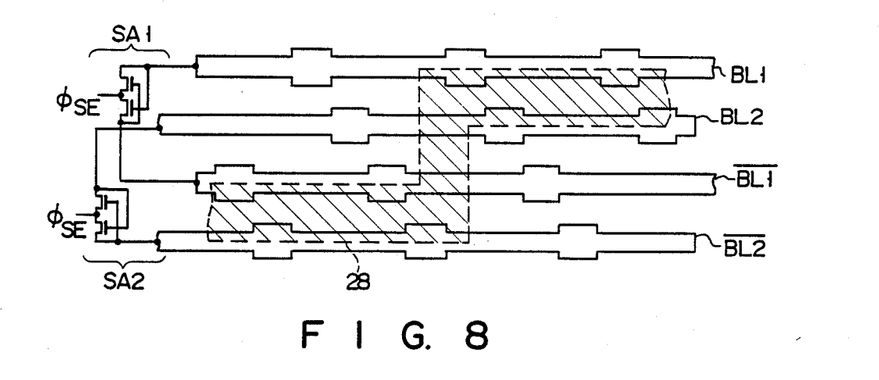

In such a memory cell array that memory cells are displaced by ¼ pitch in the channel length direction, the sense amplifiers SA1 and SA2 coupled with two pairs of bit lines arranged in a nesty fashion may be placed on the same side, as shown in FIG. 8. The layout of the sense amplifiers in this instance provides a high pattern density, and makes it difficult to pattern the sense amplifiers, but requires a reduced chip area for the sense amplifiers. This layout is also lack of the advantage resulting from the layout of the signal line away from the sense amplifiers as shown in FIG. 7. It is noted here that the wiring layer layout according to the present invention is effective even in the instant layout of the sense amplifiers.

Figure 9:
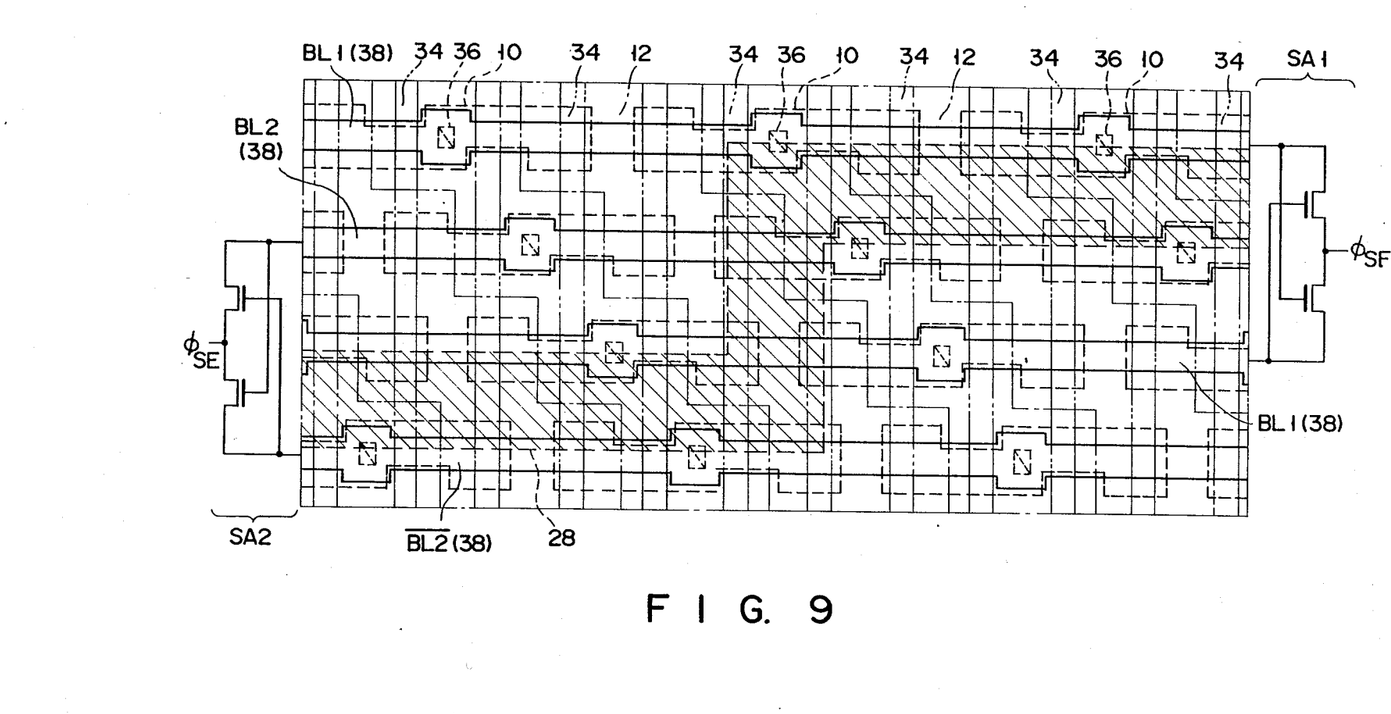
Figure 10A:
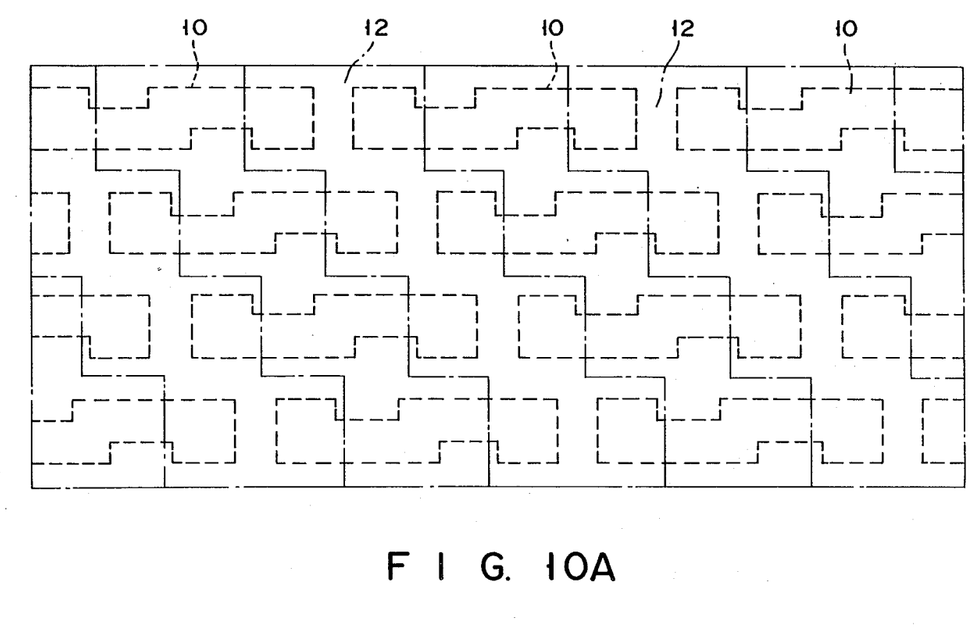
FIGS. 10A and 10B are plan views showing process steps for forming the memory cell array of FIG. 9.
Figure 10B:
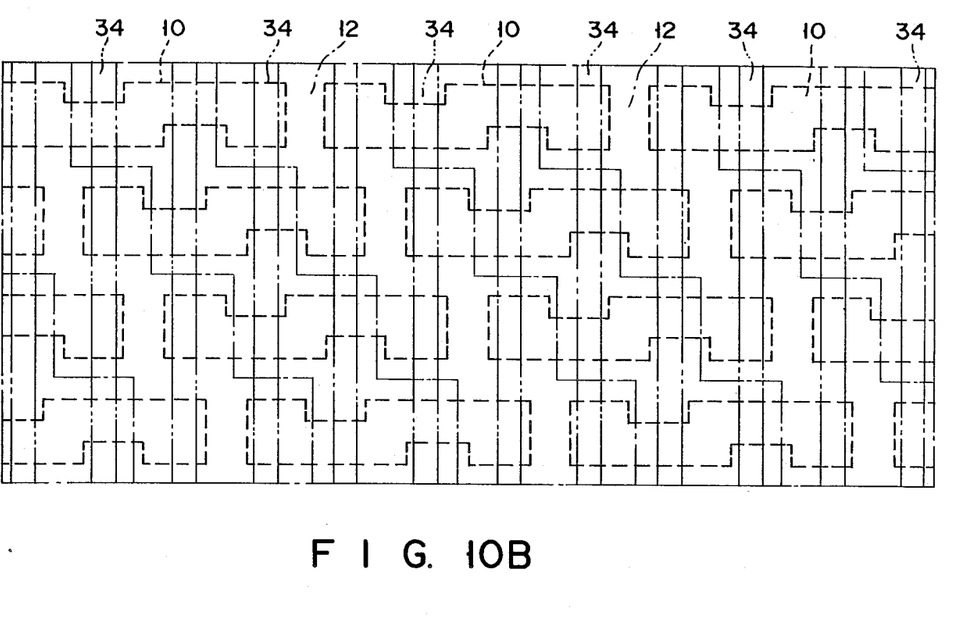

As described above, the present invention is applicable for the dynamic memory device of the type in which the memory cells are displaced by ¼ pitch in the channel length direction of the cell transistor, as shown in FIG. 1. If necessary, the invention is applicable for another dynamic memory device with a novel pattern that is different from the dynamic memory device of FIG. 1. This new ¼ pitch cell layout will be described with reference to FIGS. 9, 10A and 10B. To form the new pattern, element regions 10 is first formed on a semiconductor substrate, as shown in FIG. 10A. Then, capacitor insulating films (not shown) and cell plate electrodes 12 are formed in this order. The process steps up to this are the same as those of the conventional memory device shown in FIG. 1. Subsequently, insulating films (not shown) are formed on the element regions 10 and the cell plate electrodes 12. Gate electrodes, or word lines 34, are formed on the insulating films, as shown in FIG. 10B. And insulating film (not shown) is deposited thereon. Contact holes 36 are formed in the element regions 10, and bit lines 38 are formed as shown in FIG. 9. The pattern thus formed is advantageous over the conventional pattern of FIG. 1 in the following points.

Figure 11:
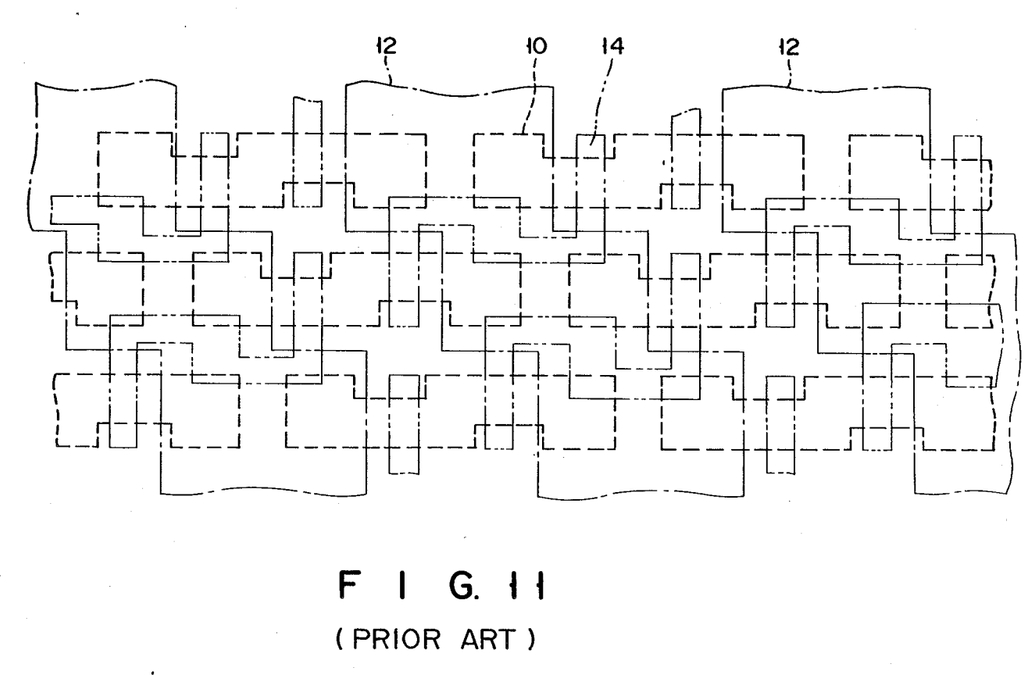
FIG. 11 shows a plan view of the FIG. 1 memory device that is incomplete in the level of the process step of forming the gate electrode.

Firstly, the integration density is improved. To explain this, a plan view of an incomplete pattern of the memory device of FIG. 1 that is formed in the level of the process step to form the gate electrodes 14 is illustrated in FIG. 11. As shown, the gate electrodes 14 are isolated like islands in the conventional memory device. Accordingly, minute gate electrode patterns must be formed. This hinders increase of the integration density. The gate electrodes 14 must be made to contact with the word lines 18 formed later, through the contact holes 20 (FIG. 1). Therefore, the gate electrodes 14 must be designed allowing for their exact alignment with the contact holes 20. This also makes it difficult to increase the integration density.

It is noted here that the word lines 34 linearly extending in the channel width direction of the cell transistor serve also as the gate electrodes of the novel pattern under discussion (FIG. 9). Accordingly, to increase the integration density, the present pattern is superior to the conventional isolated islands pattern of the gate electrodes 14. It is note again that the present pattern is not provided with the contact holes 20 for connecting the gate electrodes 14 to the word line 18. There is no area loss to secure the exact alignment. This feature contributes to the integration density improvement. Further, there is no need for the process step to form a great number of minute contact holes. This leads to a reduced number of process steps, improved production yield, and cost reduction.

The layout technique of the present invention is applicable for the instance pattern of the memory device, because a couple of bit line pairs are laid out in a nesty fashion. As shown, a signal line 28 laterally extends between and along two adjacent bit lines $\overline{BL1}$ (38) and $\overline{BL2}$ (38), is turned upwardly at a right angle to the bit lines at a predetermined position, and is turned again to the right, extending between and along the bit lines BL1 (38) and BL2 (38). The predetermined position is seletected at a point corresponding to the half of the bit line length. Therefore, the stray capacitances between the signal line 28 and each of the bit lines BL1, $\overline{BL1}$, BL2, and $\overline{BL2}$ are about $\frac{1}{2}C_F$ and equal to one another. The uniformity of the stray capacitances isattained.

The rise time and the fall time of a signal in the word line are one of major factors to determine the operating speed of the DRAM. Accordingly, the faster, the better. To realize this, it is essential to reduce resistance of the word line. One of the possible way to reduce the work line resistance is to lay an additional wire (second word line) made of Al alloy or Cu in parallel with each word line and to connect the paired word lines at proper intervals. The word line resistance can apparently be reduced. In case that the second word line is formed above the bit line, and a signal line is disposed above the second word line, the stray capacitances between the signal line and the respective bit lines are reduced to some degree by the shielding effect of the second word line. The wiring layer layout technique of the present invention may of course be applied to the memory device using the second word lines. In such a case, the memory cell pattern may be either the FIG. 1 pattern or the novel pattern.

Figure 12:
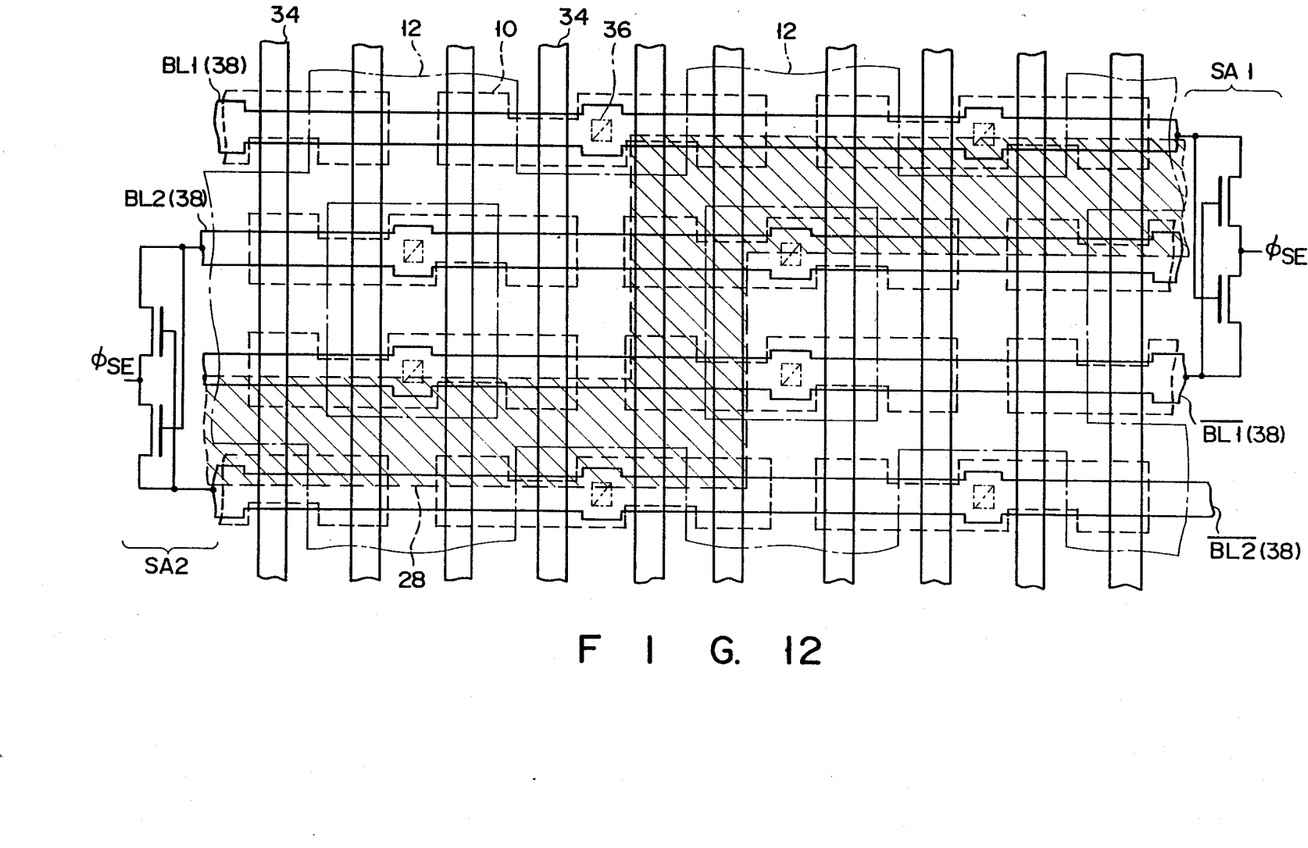
FIG. 12 is a plan view showing a layout of a conductive wiring layer according to a sixth embodiment of the present invention, in which the memory cell array used is other than the memory cell array of the $\frac{1}{4}$ pitch type.

The present invention may be applied to other types of the memory devices than the memory devices of the ¼ pitch cell layout type, so long as those memory devices are arranged such that a couple of bit line pairs are arrayed in a nesty fashion, and a signal line or a power line extends along the bit lines. An example of such memory devices is illustrated in FIG. 12. A cell pattern of the memory device is such that the memory cells on a first row are displaced by ½ pitch with respect to those on a second row, the memory cells on the second row are aligned with those on a third row, the memory cells on the third row are shifted by ½ pitch with respect to those on a fourth row, and so on through the memory cell array. Also in this memory cell array, two pairs of bit lines are arrayed in a nesty fashion, and therefore the wiring layer layout technique of the present invention is applicable for the memory cell array. As shown, a signal line 28 laterally extends between and along two adjacent bit lines $\overline{BL1}$ (38) and $\overline{BL2}$ (38), is turned upwardly at a right angle to the bit lines at a predetermined position, and is turned again to the right, extending between and along the bit lines BL1 (38) and BL2 (38). The predetermined position is selected at a point corresponding to the half of the bit line length. Therefore, the stray capacitances between the signal line 28 and each of the bit lines BL1, $\overline{BL1}$, BL2, and $\overline{BL2}$ are about ½$C_F$ and equal to one another. The uniformity of the stray capacitances is attained.

In the above-mentioned embodiments, the memory cells of the one-transistor/one-capacitor type are used, but if necessary, the trench cells or stacked cells may be used.

As seen from the foregoing description, the present invention makes the stray capacitances between a wiring layer and each bit line of bit line pairs equal to one another, by bending the wiring layer at least one time at a predetermined position. A signal line and a power line may be enumerated as the wiring layer. Accordingly, the present invention has succeeded in removing the coupling noise. The bending position may be any position so long as the equal stray capacitances are obtained. This makes the pattern design easy. Where protruded portions exist in the IC region, the wiring layer may be patterned away from the protruded portions, and so as to make the stray capacitance equal. The memory device with the wiring layer thus patterned is free from disconnection of the wiring layer at the protruded portions which otherwise is inevitable, and free from additional increase of the height of the memory IC by an amount corresponding to the thickness of the wiring layer pattern which otherwise is layered on the protruded portions. The present invention is effectively applied to the memory devices operating at a high speed, because the higher the frequency is, the larger the amount of the transferred noise is.

What is claimed is:

1. A dynamic memory device comprising:

a plurality of memory cells each including one transistor and one capacitor;

first and second bit lines each coupled with a plurality of memory cells and being arrayed in parallel with separation of a first predetermined distance;

first sense amplifier coupled with said first and second bit lines;

third and forth bit lines each coupled with a plurality of memory cells and being arrayed in parallel with separation of said first predetermined distance, said third bit line being located between said first bit line and said second bit line, and separated from said first bit line by a second predetermined distance, and said fourth bit line being separated from said second bit line by said second predetermined distance;

second sense amplifier coupled with said third and fourth bit lines; and a conductive layer extending in the bit line direction, said conductive layer extending between and along said first and third bit lines, being bent at a predetermined position, and being bent again and extending between and along said second and fourth bit lines, and a length of said conductive layer which extends between and along said first and third bit lines being equal to that of said conductive layer which extends between and along said second and fourth bit lines.

2. The device according to claim 1, wherein said predetermined position is a position corresponding to the half of each said bit line, and said conductive layer extends between and along said first and third bit lines, is bent at said predetermined position at a substantially right angle toward said fourth bit line, and is bent again at a substantially right angle and extends between and along said second and fourth bit lines.

3. The device according to claim 2, wherein said first sense amplifier and said second sense amplifier are oppositely disposed with respect to said bit lines, and said conductive layer is laid such that it extends from said first sense amplifier toward said predetermined position and between and along said first and third bit lines, and extends from said predetermined position toward said second sense amplifier and between and along said second and fourth bit lines.

4. The device according to claim 3, wherein said conductive layer is a wiring layer including one of a signal line and a power line.

5. The device according to claim 3, wherein the memory cells linearly arrayed on a first row are respectively displaced by ½$^n$ (n is a natural number equal to or larger than 2) of a distance between two adjacent cells as linearly arrayed from those linearly arrayed on a second row as viewed in a column direction.

6. The device according to claim 3, wherein the memory cells linearly arrayed on said first bit line are displaced by ½ of a distance of two adjacent memory cells as linearly arrayed from said second bit line as viewed in a column direction; the memory cells linearly arrayed on said third bit line are displaced by ½ of a distance of two adjacent memory cells as linearly arrayed from said fourth bit line as viewed in a column direction; and the memory cells linearly arrayed on said second bit line are disposed in alignment with those on said third bit line in the column direction.

7. The device according to claim 2, wherein said first sense amplifier and said second sense amplifier are oppositely disposed with respect to said bit lines, and said conductive layer is laid such that it extends from the opposite side of said first sense amplifier toward said predetermined position and between and along said first and third bit lines, and extends from said predetermined position toward said second sense amplifier and between and along said second and fourth bit lines.

8. The device according to claim 7, wherein that said conductive layer is a wiring layer including one of a signal line and a power line.

9. The device according to claim 7, wherein the memory cells linearly arrayed on a first row are respectively displaced by $\frac{1}{2}^n$ (n is a natural number equal to or larger than 2) of a distance between two adjacent cells as linearly arrayed from those linearly arrayed on a second row as viewed in a column direction.

10. The device according to claim 7, wherein the memory cells linearly arrayed on said first bit line are displaced by $\frac{1}{2}$ of a distance of two adjacent memory cells as linearly arrayed from said second bit line as viewed in a column direction; the memory cells linearly arrayed on said third bit line are displaced by $\frac{1}{2}$ of a distance of two adjacent memory cells as linearly arrayed from said fourth bit line as viewed in a column direction; and the memory cells linearly arrayed on said second bit line are disposed in alignment with those on said third bit line in the column direction.

11. The device according to claim 2, wherein said first sense amplifier and said second sense amplifier are disposed at one side of said bit lines, and said conductive layer is laid such that it extends from the opposite side of said first sense amplifier toward said predetermined position and between and along said first and third bit lines, and extends from said predetermined position toward said second sense amplifier and between and along said second and fourth bit lines.

12. The device according to claim 11, wherein said conductive layer is a wiring layer including one of a signal line and a power line.

13. The device according to claim 11, wherein the memory cells linearly arrayed on a first row are displaced by $\frac{1}{2}^n$ (n is a natural number equal to or larger than (2) of a distance between two adjacent cells as linearly arrayed from those linearly arrayed on a second row as viewed in a column direction.

14. The device according to claim 11, wherein the memory cells linearly arrayed on said first bit line are displaced by $\frac{1}{2}$ of a distance of two adjacent memory cells as linearly arrayed from said second bit line as viewed in a column direction; the memory cells linearly arrayed on said third bit line are displaced by $\frac{1}{2}$ of a distance of two adjacent memory cells as linearly arrayed from said fourth bit line as viewed in a column direction; and the memory cells linearly arrayed on said second bit line are disposed in alignment with those on said third bit line in the column direction.

15. The device according to claim 1, wherein said predetermined position includes first and second positions, and said conductive layer extends toward said first position and between and along said second and fourth bit lines, is bent at a substantially right angle at said first position toward said first bit line, is bent again at a substantially right angle and extends toward said second position between and along said first and second bit lines, is bent at a substantially right angle at said second position toward said fourth bit line, and is bent at a substantially right angle and extends between and along said second and fourth bit lines.

16. The device according to claim 15, wherein said first position is a position corresponding to $\frac{1}{4}$ of the bit line length, and said second position is a position corresponding to $\frac{3}{4}$ of the bit line length.

17. The device according to claim 16, wherein said first sense amplifier and said second sense amplifier are oppositely disposed with respect to said bit lines, and said conductive layer extends from said first sense amplifier toward said first position and between and along said second and fourth bit lines, extends from said first position to said second position and between and along said first and third bit lines, and extends from said second position toward said second sense amplifier and between and along said second and fourth bit lines.

18. The device according to claim 17, wherein said conductive layer is a wiring layer including one of a signal line and a power line.

19. The device according to claim 17, wherein the memory cells linearly arrayed on a first row are respectively displaced by $\frac{1}{2}^n$ (n is a natural number equal to or larger than 2) of a distance between two adjacent cells as linearly arrayed from those linearly arrayed on a second row as viewed in a column direction.

20. The device according to claim 17, wherein the memory cells linearly arrayed on said first bit line are displaced by $\frac{1}{2}$ of a distance of two adjacent memory cells as linearly arrayed from said second bit line as viewed in a column direction; the memory cells linearly arrayed on said third bit line are displaced by $\frac{1}{2}$ of a distance of two adjacent memory cells as linearly arrayed from said fourth bit line as viewed in a column direction; and the memory cells linearly arrayed on said second bit line are disposed in alignment with those on said third bit line in the column direction.

* * * * *